(12) United States Patent
Yuan et al.

(10) Patent No.: US 7,930,579 B2
(45) Date of Patent: Apr. 19, 2011

(54) VOLTAGE TEST CIRCUIT FOR COMPUTER POWER SUPPLY

(75) Inventors: Zhi-Sheng Yuan, Shenzhen (CN);
Ren-Jun Xiao, Shenzhen (CN);
Xiao-Lin Gan, Shenzhen (CN);
Yu-Kuang Ho, Taipei Hsien (TW)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 788 days.

(21) Appl. No.: 11/869,754

(22) Filed: Oct. 10, 2007

(65) Prior Publication Data

US 2008/0122477 A1 May 29, 2008

(30) Foreign Application Priority Data

Nov. 27, 2006 (TW) ............................... 95143811 A

(51) Int. Cl.
*G06F 1/00* (2006.01)
*G06F 11/30* (2006.01)
*G01R 31/40* (2006.01)
(52) U.S. Cl. .................................. 713/340; 324/764.01
(58) Field of Classification Search .................. 324/119, 324/120, 149, 461, 508, 537, 753, 754, 758, 324/761, 763, 771; 713/300
See application file for complete search history.

(56) References Cited

U.S. PATENT DOCUMENTS

| 4,152,639 | A |   | 5/1979  | Chaffee |       |
|-----------|---|---|---------|---------|-------|
| 4,357,574 | A | * | 11/1982 | Takamisawa et al. | 324/72.5 |
| 6,504,395 | B1 | * | 1/2003 | Johnson | 324/765 |
| 2002/0006045 | A1 | * | 1/2002 | Shirai et al. | 363/17 |
| 2006/0026420 | A1 | * | 2/2006 | Babb et al. | 713/150 |
| 2006/0209483 | A1 | * | 9/2006 | Hurwicz | 361/115 |
| 2008/0030925 | A1 | * | 2/2008 | Liu | 361/517 |
| 2008/0059104 | A1 | * | 3/2008 | Delory | 702/118 |

OTHER PUBLICATIONS

ATX Specification Version 2.2, 2004, Intel Corporation, pp. 8-44.*
ATX Power Supply Design Guide, version 2.2, Mar. 2005, Intel Corporation, pp. 7-24.*

* cited by examiner

*Primary Examiner* — Thomas Lee
*Assistant Examiner* — Brandon Kinsey
(74) *Attorney, Agent, or Firm* — Frank R. Niranjan

(57) ABSTRACT

A voltage test circuit for testing a computer power supply includes a voltage input unit configured for receiving voltages from the computer power supply, a voltage output unit configured for outputting the voltages to a plurality of electrical loads, a test unit, a switch control unit, and a capacitive load module. The test unit is connected between the voltage input unit and the voltage output unit for testing output ripple and noise of the voltages. The capacitive load module includes a plurality of capacitive loads. The switch control unit is connected between the voltage input unit and the capacitive module for selecting a suitable capacitive load according to the computer power supply.

14 Claims, 2 Drawing Sheets

VOLTAGE TEST CIRCUIT FOR COMPUTER POWER SUPPLY

BACKGROUND

1. Field of the Invention

The present invention relates to test circuits, and particularly to a voltage test circuit for testing a computer power supply.

2. Description of Related Art

A computer power supply is typically designed to convert 110V-240V AC from the mains, to several low-voltage DC outputs for internal components of the computer. The most common computer power supplies are built to conform to the ATX form factor. Before selling, manufacturers need to perform tests on the computer power supplies, such as output ripple test, noise test, compatibility test for capacitive load, and so on.

A conventional voltage test circuit for testing a computer power supply includes a plurality of connectors, filter capacitors, and electrical loads. The connectors are configured for simulating power interfaces of a motherboard. Connectors of the computer power supply are plugged into the corresponding connectors of the voltage test circuit, and nodes between the connectors of the computer power supply and the corresponding connectors of the voltage test circuit are grounded via the filter capacitors, and connected to the electrical loads. When voltages of the computer power supply are tested, each of the nodes between the connectors of the computer power supply and the corresponding connectors of the voltage test circuit is also connected to an oscilloscope via a lead to inspect output ripple and noise level of the voltages of the computer power supply. And then some capacitive loads and the electrical loads are connected to the connectors of the computer power supply. The compatibility level of the computer power supply can be determined by examining indicators of the electrical loads. However, with the ever increasing speeds of computers, standards of the computer power supply are more complicated than before, and the connectors of the conventional test circuit can not satisfy that trend. Further, the oscilloscope is connected to the computer power supply via a probe of the oscilloscope, the probe often does not make good enough contact with the nodes between the connectors of the computer power supply and the corresponding connectors of the voltage test circuit, and so the test results may not be accurate. Moreover, the capacitive loads need to be soldered onto the voltage test circuit every time, which wastes time and is very inconvenient.

What is desired, therefore, is to provide a voltage test circuit which overcomes the above problems.

SUMMARY

An embodiment of a voltage test circuit for testing a computer power supply includes a voltage input unit configured for receiving voltage from the computer power supply, a voltage output unit configured for outputting the voltages to a plurality of electrical loads, a test unit, a switch control unit, and a capacitive load module. The test unit is connected between the voltage input unit and the voltage output unit for testing output ripple and noise of the voltages. The capacitive load module includes a plurality of capacitive loads. The switch control unit is connected between the voltage input unit and the capacitive module for selecting a suitable capacitive load according to the computer power supply.

Other advantages and novel features of the present invention will become more apparent from the following detailed description of an embodiment when taken in conjunction with the accompanying drawings, in which:

DETAILED DESCRIPTION

Figure 1:
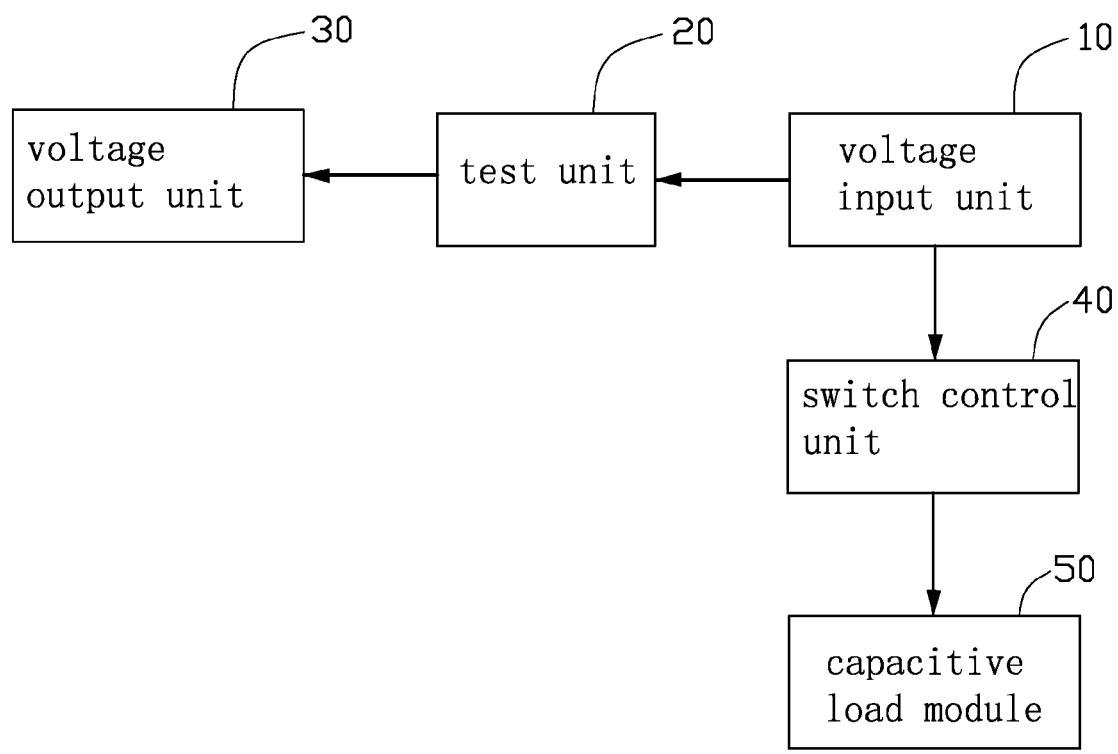
FIG. 1 is a block diagram of a voltage test circuit in accordance with an embodiment of the present invention.
Figure 2:
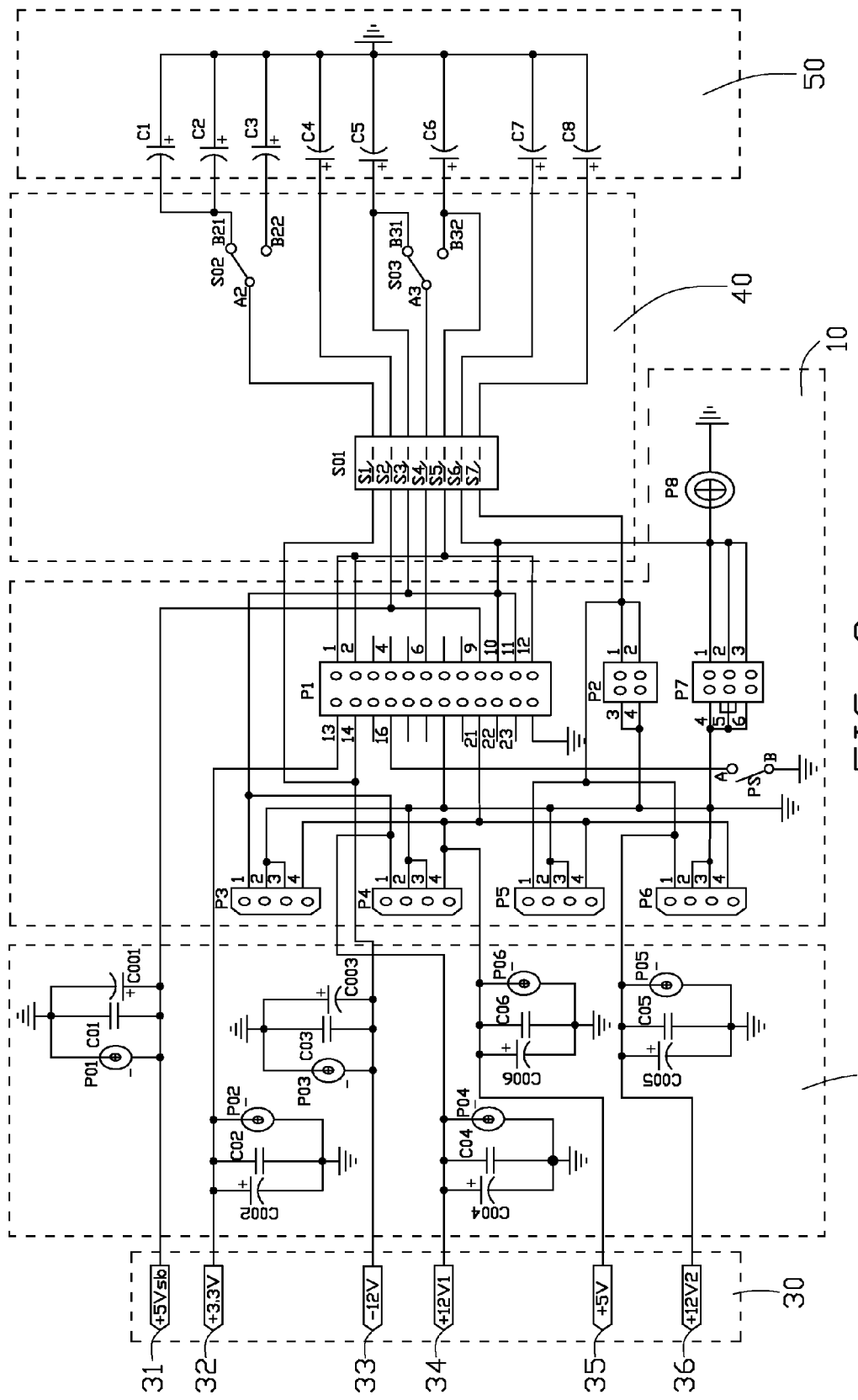
FIG. 2 is a circuit diagram of FIG. 1.

Referring to FIGS. 1 and 2, a voltage test circuit in accordance with an embodiment of the present invention is provided to test a computer power supply. The voltage test circuit includes a voltage input unit 10, a test unit 20, a voltage output unit 30, a switch control unit 40, and a capacitive load module 50. The voltage input unit 10 is connected to the computer power supply to receive different voltages from the computer power supply. The voltage output unit 30 is connected to the voltage input unit 10 via the test unit 20 for outputting corresponding voltage. The switch control unit 40 is connected between the voltage input unit 10 and the capacitive load module 50 for selecting a capacitive load according to the computer power supply.

The voltage input unit 10 includes first~eighth connectors P1~P8 configured for simulating corresponding power interfaces of a motherboard, and an input switch PS. The voltage output unit 30 includes a first output 31 configured for outputting a first output voltage +5 Vsb, a second output 32 configured for outputting a second output voltage +3.3V, a third output 33 configured for outputting a third output voltage −12V, a fourth output 34 configured for outputting a fourth output voltage +12V1, a fifth output 35 configured for outputting a fifth output voltage +5V, and a sixth output 36 configured for outputting a sixth output voltage +12V2.

The first connector P1 is a twenty-four pin connector configured for simulating a main power interface of the motherboard, which satisfies both ATX and BTX standards. The first connector P1 includes a pin 9 connected to the first output 31; four pins 1, 2, 12, and 13 connected to the second output 32; a pin 14 connected to the third output 33; two pins 10 and 11 connected to the fourth output 34; five pins 4, 6, 21, 22, and 23 connected to the fifth output 35; a PS_ON switch pin 16 connected to a terminal A of the input switch PS; and a plurality of ground pins. The other terminal B of the input switch PS is grounded.

The second connector P2 is a four-pin connector configured for simulating a power interface for supplying power to a CPU of the motherboard. The second connector P2 includes two pins 1 and 2 connected to the sixth output 36; and two ground pins 3 and 4 connected to ground.

The third, fourth, fifth, and six connectors P3~P6 are four-pin connectors, different from the second connector P2, configured for simulating power interfaces for supplying power to HDDs and CD drivers of the motherboard. The third and fourth connectors P3 and P4 each include a pin 1 connected the fourth output 34. The fifth and sixth connectors P5 and P6 each include a pin 1 connected the sixth output 36. The third, fourth, fifth, and sixth connectors P3~P6 each include a pin 2 and a pin 3 all connected to ground, and a pin 4 connected to the fifth output 35.

The seventh connector P7 is a six-pin connector configured for simulating power interfaces for supplying power to peripheral elements of the motherboard. The seventh connector P7 includes three pins 1, 2, and 3 connected to the fourth output 34. Other pins of the seventh connector P7 are grounded.

The eighth connector P8 is an alternating current (AC) adapter connector, one terminal of the eighth connector P8 is connected to the pins 1, 2, and 3 of the seventh connector P7, and the other terminal of the eighth connector P8 is grounded. The amount of the connectors can be increased according to need.

The test unit 20 includes six porcelain capacitors C01~C06, six electrolytic capacitors C001~C006, and six test ports P01~P06. In this embodiment, the specification of the porcelain capacitors C01~C06 are 25V/0.1 µF. The specification of the electrolytic capacitors C001~C006 are 25V/10 µF. The test ports P01~P06 are made of conductive metal sleeves, thereby having better contact with any testing probe, and having better noise shielding function.

The first porcelain capacitor C01, first electrolytic capacitor C001, and first test port P01 are connected between the first output 31 and ground in parallel. The second porcelain capacitor C02, second electrolytic capacitor C002, and second test port P02 are connected between the second output 32 and ground in parallel. The third porcelain capacitor C03, third electrolytic capacitor C003, and third test port P03 are connected between the third output 33 and ground in parallel. The fourth porcelain capacitor C04, fourth electrolytic capacitor C004, and fourth test port P04 are connected between the fourth output 34 and ground in parallel. The fifth porcelain capacitor C05, fifth electrolytic capacitor C005, and fifth test port P05 are connected between the fifth output 35 and ground in parallel. The sixth porcelain capacitor C06, sixth electrolytic capacitor C006, and sixth test port P06 are connected between the sixth output 36 and ground in parallel.

The switch control unit 40 includes a first switch S01, a second switch S02, and a third switch S03. The first switch S01 includes seven sub-switches S1~S7. One terminal of the sub-switch S1 is connected to the pin 14 of the first connector P1. One terminal of the sub-switch S2 is connected to the pin 9 of the first connector P1. One terminal of the sub-switch S3 is connected to the pin 1 of the third connector P3. One terminal of the sub-switch S4 is connected to the pin 6 of the first connector P1. One terminal of the sub-switch S5 is connected to the pin 1 of the first connector P1. One terminal of the sub-switch S6 is connected to the pin 10 of the first connector P1. One terminal of the sub-switch S7 is connected to the pin 1 of the second connector P2. The second switch S02 and third switch S03 are single-pole double-throw (SPDT) switches. A pole A2 of the second switch S02 is connected to the other terminal of the sub-switch S1. A pole A3 of the third switch S03 is connected to the other terminal of the sub-switch S4.

The capacitive load module 50 includes first~eighth electrolytic capacitors C1~C8. In this embodiment, the specifications of the first, second, and fifth electrolytic capacitors C1, C2, and C5 are 25V/10000 µF. The specifications of the third and fourth electrolytic capacitors C3 and C4 are 25V/330 µF. The specification of the sixth electrolytic capacitor C6 is 16V/6000 µF. The specification of the seventh electrolytic capacitor C7 is 25V/5000 µF. The specification of the eighth electrolytic capacitor C8 is 25V/3000 µF. Cathodes of the first and second electrolytic capacitors C1, C2 are connected together to a first throw B21 of the second switch S02. The cathode of the third electrolytic capacitor C3 is connected to a second throw B22 of the second switch S02. Anodes of the first, second, and third electrolytic capacitors C1, C2, C3 are grounded. The anode of the fourth electrolytic capacitor C4 is connected to the other terminal of the sub-switch S2 of the first switch S01. The anode of the fifth electrolytic capacitor C5 is connected to the other terminal of the sub-switch S3 of the first switch S01 and a first throw B31 of the third switch S03. The anode of the sixth electrolytic capacitor C6 is connected to the other terminal of the sub-switch S5 of the first switch S01 and a second throw B32 of the third switch S03. The anode of the seventh electrolytic capacitor C7 is connected to the other terminal of the sub-switch S6 of the first switch S01. The anode of the eighth electrolytic capacitor C8 is connected to the other terminal of the sub-switch S7 of the first switch S01. Cathodes of the fourth~eighth electrolytic capacitors C1~C8 are grounded.

When testing a computer power supply, power connectors of the power supply are plugged into the connectors P1~P8 of the voltage input unit 10 correspondingly. A plurality of electrical loads (not shown) configured for simulating working status of a motherboard are connected to the outputs 31~36 of the voltage output unit 30. After closing the input switch PS, the computer power supply supplies power to the voltage test circuit. A probe of an oscilloscope (not shown) is plugged in to inspect the test ports P01~P06 respectively for testing output ripple and noise of the voltages received by the connectors P1~P8. When compatibility level testing begins, if the power supply satisfies the ATX standard, the pole A2 is connected to the first throw B21 of the second switch S02 and the pole A3 is connected to the first throw B31 of the third switch S03. If the power supply satisfies the BTX standard, the pole A2 is connected to the second throw B22 of the second switch S02 and the pole A3 is connected to the second throw B32 of the third switch S03. The sub-switches S1~S7 of the first switch S01 are selectively turned on or off according to need for judging compatibility of each output voltage from the outputs 31~36 according to indicators of the electrical loads.

The test unit 20 has a plurality of test ports P01~P06 having good shielding function, which can test output ripple and noise more accurately. Further, the switch control unit 40 and the capacitive load module 50 can save testing time and reduce testing costs.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A voltage test circuit for testing a computer power supply, comprising:
   a voltage input unit configured for receiving voltages from the computer power supply;
   a voltage output unit configured for outputting the voltages to a plurality of electrical loads;
   a test unit connected between the voltage input unit and the voltage output unit for testing output ripple and noise of the voltages;
   a switch control unit; and
   a capacitive load module having a plurality of capacitive loads, the switch control unit connected between the voltage input unit and the capacitive load module for selecting a suitable capacitive load according to the computer power supply;
   wherein the voltage input unit comprises first~eighth connectors configured for simulating corresponding power interfaces of a motherboard, and an input switch configured for making the computer power supply, supply power to the voltage test circuit, the voltage output unit comprises first~sixth outputs configured for respectively outputting a first output voltage +5 Vsb, a second output voltage +3.3V, a third output voltage −12V, a fourth output voltage +12V1, a fifth output voltage +5V, and a sixth output voltage +12V2 corresponding to the computer power supply;

wherein the switch control unit includes a first switch, a second switch, and a third switch, the first switch includes first~seventh sub-switches, one terminal of the first sub-switch is connected to the third output via the first connector, one terminal of the second sub-switch is connected to the first output via the first connector, one terminal of the third sub-switch is connected to the fourth output via the third connector, one terminal of the fourth sub-switch is connected to the fifth output via the first connector, one terminal of the fifth sub-switch is connected to the second output via the first connector, one terminal of the sixth sub-switch is connected to the fourth output via the first connector, one terminal of the seventh sub-switch is connected to the sixth output via the second connector, the second switch and third switch are single-pole double-throw (SPDT) switches, a pole of the second switch is connected to the other terminal of the first sub-switch, a pole of the third switch is connected to the other terminal of the fourth sub-switch, throws of the second and third switches are correspondingly connected to the capacitive load module.

2. The voltage test circuit as claimed in claim 1, wherein the first connector is a twenty-four pin connector configured for simulating a main power interface of the motherboard, and comprises a pin connected to the first output, four pins connected to the second output, a pin connected to the third output, two pins connected to the fourth output, five pins connected to the fifth output, a switch pin connected to a terminal of the input switch, and a plurality of ground pins, the other terminal of the input switch is grounded.

3. The voltage test circuit as claimed in claim 2, wherein the second connector is a four-pin connector configured for simulating a power interface for supplying power to a CPU of the motherboard, and comprises two pins connected to the sixth output, and two ground pins connected to ground.

4. The voltage test circuit as claimed in claim 3, wherein the third, fourth, fifth, and six connectors are four-pin connectors configured for simulating power interfaces for supplying power to HDDs and CD drivers of the motherboard, the third and fourth connectors each include a pin connected the fourth output, the fifth and sixth connectors each include a pin connected the sixth output, the third, fourth, fifth, and sixth connectors each include two pins connected to ground, and a pin connected to the fifth output.

5. The voltage test circuit as claimed in claim 4, wherein the seventh connector is a six-pin connector configured for simulating power interfaces for supplying power to peripheral elements of the motherboard, and comprises three pins connected to the fourth output, other pins of the seventh connector are grounded.

6. The voltage test circuit as claimed in claim 5, wherein the eighth connector is an alternating current (AC) adapter connector, one terminal of the eighth connector is connected to the fourth output via the seventh connector, and the other terminal of the eighth connector is grounded.

7. The voltage test circuit as claimed in claim 1, wherein the test unit includes six porcelain capacitors, six electrolytic capacitors, and six test ports, each of the porcelain capacitors is connected in parallel with a corresponding electrolytic capacitor and a corresponding test port made of conductive metal sleeves, and then connected between the corresponding output and ground.

8. The voltage test circuit as claimed in claim 7, wherein the specification of the six porcelain capacitors are 25V/0.1 µF, the specification of the six electrolytic capacitors are 25V/10 µF.

9. The voltage test circuit as claimed in claim 1, wherein the capacitive load module includes first~eighth electrolytic capacitors, cathodes of the first and second electrolytic capacitors are connected together to a first throw of the second switch, the cathode of the third electrolytic capacitor is connected to a second throw of the second switch, anodes of the first, second and third electrolytic capacitors are grounded, the anode of the fourth electrolytic capacitor is connected to the other terminal of the second sub-switch of the first switch, the anode of the fifth electrolytic capacitor is connected to the other terminal of the third sub-switch of the first switch and a first throw of the third switch, the anode of the sixth electrolytic capacitor is connected to the other terminal of the fifth sub-switch of the first switch and a second throw of the third switch, the anode of the seventh electrolytic capacitor is connected to the other terminal of the sixth sub-switch of the first switch, the anode of the eighth electrolytic capacitor is connected to the other terminal of the seventh sub-switch of the first switch, cathodes of the fourth~eighth electrolytic capacitors are grounded.

10. The voltage test circuit as claimed in claim 9, wherein the specifications of the first, second, and fifth electrolytic capacitors are 25V/10000 µF, the specifications of the third and fourth electrolytic capacitors are 25V/330 µF, the specification of the sixth electrolytic capacitor is 16V/6000 µF, the specification of the seventh electrolytic capacitor is 25V/5000 µF, the specification of the eighth electrolytic capacitor is 25V/3000 µF.

11. A voltage test circuit for testing a computer power supply, comprising:

a voltage input unit configured for receiving voltages from the computer power supply, the voltage input unit comprising a plurality of connectors configured for simulating corresponding power interfaces of a motherboard, and an input switch configured for controlling the computer power supply supplying power to the voltage test circuit;

a voltage output unit comprising a plurality of outputs configured for respectively outputting the voltages to a plurality of electrical loads;

a test unit connected between the voltage input unit and the voltage output unit, the testing unit comprising a plurality of test ports made of conductive sleeve respectively connected to the outputs to allow a test tool being inserted into to test output ripple and noise of the voltages;

a capacitive load module having a plurality of capacitive loads; and a switch control unit connected between the voltage input unit and the capacitive load module for selecting a suitable capacitive load according to the computer power supply;

wherein the voltage input unit comprises first~eighth connectors, the first connector is a twenty-four pin connector configured for simulating a main power interface of the motherboard, the second connector is a four-pin connector configured for simulating a power interface for supplying power to a CPU of the motherboard, the third, fourth, fifth, and six connectors are four-pin connectors configured for simulating power interfaces for supplying power to HDDs and CD drivers of the motherboard, the seventh connector is a six-pin connector configured for simulating power interfaces for supplying power to peripheral elements of the motherboard, and the eighth connector is an alternating current (AC) adapter connector;

wherein the switch control unit includes a first switch, a second switch, and a third switch, the first switch includes first~seventh sub-switches, one terminal of the first sub-switch is connected to the third output via the first connector, one terminal of the second sub-switch is connected to the first output via the first connector, one terminal of the third sub-switch is connected to the fourth output via the third connector, one terminal of the fourth sub-switch is connected to the fifth output via the first connector, one terminal of the fifth sub-switch is connected to the second output via the first connector, one terminal of the sixth sub-switch is connected to the fourth output via the first connector, one terminal of the seventh sub-switch is connected to the sixth output via the second connector, the second switch and third switch are single-pole double-throw (SPDT) switches, a pole of the second switch is connected to the other terminal of the first sub-switch, a pole of the third switch is connected to the other terminal of the fourth sub-switch, the throw of the second and third switches are correspondingly connected to the capacitive load module.

12. The voltage test circuit as claimed in claim 11, wherein the test unit further comprises a plurality of porcelain capacitors and a plurality of electrolytic capacitors, and each of the porcelain capacitors is connected in parallel with a corresponding electrolytic capacitor and a corresponding test port, and then connected between the corresponding output and ground.

13. The voltage test circuit as claimed in claim 11, wherein the capacitive load module includes first~eighth electrolytic capacitors, cathodes of the first and second electrolytic capacitors are connected together to a first throw of the second switch, the cathode of the third electrolytic capacitor is connected to a second throw of the second switch, anodes of the first, second and third electrolytic capacitors are grounded, the anode of the fourth electrolytic capacitor is connected to the other terminal of the second sub-switch of the first switch, the anode of the fifth electrolytic capacitor is connected to the other terminal of the third sub-switch of the first switch and a first throw of the third switch, the anode of the sixth electrolytic capacitor is connected to the other terminal of the fifth sub-switch of the first switch and a second throw of the third switch, the anode of the seventh electrolytic capacitor is connected to the other terminal of the sixth sub-switch of the first switch, the anode of the eighth electrolytic capacitor is connected to the other terminal of the seventh sub-switch of the first switch, cathodes of the fourth~eighth electrolytic capacitors are grounded.

14. The voltage test circuit as claimed in claim 13, wherein the specifications of the first, second, and fifth electrolytic capacitors are 25V/10000 μF, the specifications of the third and fourth electrolytic capacitors are 25V/330 μF, the specification of the sixth electrolytic capacitor is 16V/6000 μF, the specification of the seventh electrolytic capacitor is 25V/5000 μF, the specification of the eighth electrolytic capacitor is 25V/3000 μF.

* * * * *